(12) United States Patent
Bonilla et al.

(10) Patent No.: US 9,431,292 B1
(45) Date of Patent: Aug. 30, 2016

(54) ALTERNATE DUAL DAMASCENE METHOD FOR FORMING INTERCONNECTS

(71) Applicant: GLOBALFOUNDRIES INC., Grand Cayman (KY)

(72) Inventors: Griselda Bonilla, Fishkill, NY (US); Samuel S. S. Choi, Beacon, NY (US); Ronald G. Filippi, Wappingers Falls, NY (US); Elbert E. Huang, Carmel, NY (US); Naftali E. Lustig, Croton on Hudson, NY (US); Andrew H. Simon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/698,948

(22) Filed: Apr. 29, 2015

(51) Int. Cl.
*H01L 21/4763* (2006.01)
*H01L 21/768* (2006.01)
*H01L 23/532* (2006.01)

(52) U.S. Cl.
CPC ... *H01L 21/76808* (2013.01); *H01L 21/76835* (2013.01); *H01L 21/76846* (2013.01); *H01L 21/76873* (2013.01); *H01L 21/76879* (2013.01); *H01L 23/53238* (2013.01); *H01L 23/53295* (2013.01)

(58) Field of Classification Search
CPC ............... H01L 23/53295; H01L 21/76808
See application file for complete search history.

(56) References Cited

U.S. PATENT DOCUMENTS

| 5,872,062 | A | 2/1999 | Hsu | |
|---|---|---|---|---|
| 6,040,243 | A | 3/2000 | Li et al. | |
| 6,261,950 | B1 | 7/2001 | Tobben et al. | |
| 6,642,138 | B2 * | 11/2003 | Hsu | 257/E21.579 |
| 6,939,791 | B2 | 9/2005 | Geffken et al. | |
| 7,196,002 | B2 * | 3/2007 | Su | 257/E21.579 |
| 7,544,609 | B2 | 6/2009 | Angyal et al. | |
| 8,357,609 | B2 | 1/2013 | Ryan | |
| 8,728,906 | B2 | 5/2014 | Chang | |
| 8,765,595 | B2 | 7/2014 | Cooney, III et al. | |
| 2013/0109148 | A1 | 5/2013 | Oh et al. | |
| 2014/0138797 | A1 | 5/2014 | Cheng | |
| 2014/0141578 | A1 | 5/2014 | Brink | |
| 2014/0151851 | A1 | 6/2014 | Dunn et al. | |
| 2014/0183735 | A1 | 7/2014 | Zhang et al. | |

* cited by examiner

*Primary Examiner* — Zandra Smith
*Assistant Examiner* — Andre' C Stevenson
(74) *Attorney, Agent, or Firm* — Scully, Scott, Murphy & Presser, P.C.

(57) ABSTRACT

After forming at least one opening in a material stack comprising a sacrificial metal template layer overlying a first dielectric material layer, a sacrificial material portion is deposited in the at least one opening as a place holder for an interconnect structure later formed. Next, the sacrificial metal template layer is removed and a second dielectric material layer is formed to fill voids that were previously occupied by the sacrificial metal template layer. After removing the sacrificial material portion from the at least one opening, an interconnect structure is formed within the at least one opening.

20 Claims, 8 Drawing Sheets

ALTERNATE DUAL DAMASCENE METHOD FOR FORMING INTERCONNECTS

BACKGROUND

The present application relates to the fabrication of interconnect structures for semiconductor devices and, more particularly to methods for minimizing metal contamination and dielectric damage that typically occur during the formation of interconnect structures.

Integrated circuits (ICs) commonly use metal interconnects to connect semiconductor devices such as, for example, transistors, on the ICs. Metal interconnects are typically fabricated using a damascene process in which trenches and vias are etched into dielectric layers. The trenches and vias are filled with a metal, which is then planarized using, for example, a chemical-mechanical planarization (CMP) process.

The damascene approach requires incorporation of low-k dielectric materials (e.g., materials with dielectric constants less than about 4.0) to reduce capacitive coupling between adjacent interconnects. The high capacitive coupling can cause cross talk and/or resistance-capacitance (RC) delay, thus degrading the overall performance of the ICs. However, directly patterning a low-k dielectric material layer during the conventional damascene process normally results in deformation in etch pattern profile due to the low mechanical strength of the low-k dielectric materials. The deformed etch pattern profile adversely impacts the reliability of the ICs through its effect on the continuity and conformality of metal deposition in a later process step. As integrated circuit technology continues to scale down to smaller technology nodes, methods that allow good profile and dimension control of damascene pattern are needed.

SUMMARY

The present application provides methods for minimizing dielectric damage that typically occur during the fabrication of interconnect structures in a damascene process by forming interconnect openings in a sacrificial metal template layer which is replaced by a low-k dielectric layer in a later processing step. The sacrificial metal template layer possesses a greater mechanical strength than low-k dielectric materials, thus providing a better control over the profile and dimension of damascene pattern. After forming at least one opening in a material stack comprising a sacrificial metal template layer overlying a first dielectric material layer, a sacrificial material portion is deposited in the at least one opening as a place holder for an interconnect structure later formed. Next, the sacrificial metal template layer is removed and a second dielectric material layer is formed to fill voids that were previously occupied by the sacrificial metal template layer. After removing the sacrificial material portion from the at least one opening, an interconnect structure is formed within the at least one opening.

In one aspect of the present application, a method of forming an interconnect structure is provided.

In one embodiment, the method includes first forming at least one opening through a material stack that includes a first dielectric material layer and a sacrificial metal template layer present on the first dielectric material layer. Next, a sacrificial material portion is formed to fill the at least one opening. After removing the sacrificial metal template layer to provide voids surrounding the sacrificial material portion, a second dielectric material layer is formed to fill the voids. The sacrificial material portion is then removed from the at least one opening within which a conductive material layer is formed.

In another embodiment, the method includes first forming at least one opening through a material stack that includes a first dielectric material layer and a sacrificial metal template layer present on the first dielectric material layer. A protective liner is then formed on sidewalls and a bottom surface of the at least one opening. Next, a sacrificial material portion is formed to fill the at least one opening. After removing the sacrificial metal template layer to provide voids surrounding the sacrificial material portion, a second dielectric material layer is formed to fill the voids. The sacrificial material portion is then removed from the at least one opening. After removing at least a portion of the protective liner that is present on the bottom surface of the at least one opening, a conductive material layer is formed to fill the at least one opening.

DETAILED DESCRIPTION

Figure 1:
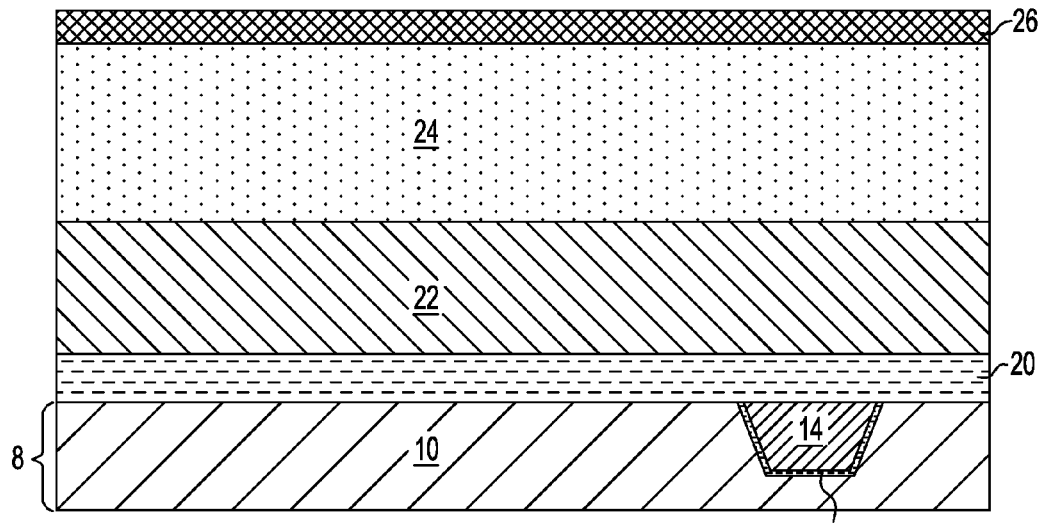
FIG. 1 is a cross-sectional view of a first exemplary semiconductor structure after forming a material stack including, from bottom to top, a dielectric cap layer, a first dielectric material layer and a sacrificial metal template layer over a lower interconnect level and a dielectric hard mask layer over the material stack according to a first embodiment of present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to a first embodiment of the present application includes a lower interconnect level 8 on which a material stack and a dielectric hard mask layer 26 are formed. The lower interconnect level 8 is typically formed on a semiconductor substrate containing semiconductor devices such as field effect transistors (not shown). The lower interconnect level 8 may include a base dielectric material layer 10 and at least one first conductive structure 14 embedded therein. The at least one first conductive structure 14 is separated from the base dielectric material layer 10 by a first diffusion barrier 12.

The base dielectric material layer 10 typically includes a low-k dielectric material. Exemplary low-k dielectric materials include, but are not limited to, silicon dioxide, organosilicates, silsequioxanes, undoped silicate glass (USG), fluorosilicate glass (FSG), and borophosphosilicate glass (BPSG). The base dielectric material layer 10 may be formed on the topmost surface of the substrate (not shown) utilizing any conventional deposition process including, for example, chemical vapor deposition (CVD), plasma enhanced chemical vapor deposition (PECVD), evaporation, chemical solution deposition or spin coating. The base dielectric material layer 10 that is formed may have a thickness from 100 nm to 1,000 nm, although lesser and greater thicknesses can also be employed.

Following the formation of the base dielectric material layer 10, the base dielectric material layer 10 is subsequently patterned by lithography (applying a photoresist, exposing the applied photoresist to a desired pattern of radiation and development) and etching (dry etching, wet etching or a combination thereof) to provide at least one opening (not shown) within the base dielectric material layer 10 within which the at least one first conductive structure 14 will be subsequently formed. The at least one opening may be a via opening, a trench opening or a combination of a via and a trench opening. In some embodiments, the combined via and trench openings may be formed one directly atop the other such that the two openings are in electrical communication with each other. The patterning of the base dielectric material layer 10 may occur with a hard mask (not shown) located on the top surface of the base dielectric material layer 10. The hard mask is typically removed after filling the at least one opening with a conductive material and subjecting the structure to planarization. During the etching process, the patterned photoresist can be removed utilizing a conventional stripping process after transferring the pattern into at least the hard mask.

Next, the first diffusion barrier 12 is formed on the exposed surfaces of the base dielectric material layer 10 within the at least one opening. The first diffusion barrier 12 may include Ta, TaN, W, WN, TiN, a stack thereof such as Ta/TaN, Ta/TaN/Ta and Ti/TiN, or any other material that can serve as a barrier to prevent conductive material from diffusing therethrough. The first diffusion barrier 12 may be formed by a conventional deposition process including, for example, CVD, PECVD, atomic layer deposition (ALD), physical vapor deposition (PVD), sputtering, chemical solution deposition or plating. The first diffusion barrier 12 that is formed may have a thickness from about 4 nm to about 40 nm, although lesser and greater thicknesses can also be employed.

After lining the at least one opening with the first diffusion barrier 12, the first conductive structure 14 is formed by depositing a conductive material to fill the at least one opening. The conductive material which is used in forming the first conductive structure 14 may include polysilicon, a conductive metal such as, for example, Cu, W or Al, an alloy comprising at least one conductive metal, a conductive metal silicide or combinations thereof. The conductive material may be deposited utilizing a conventional deposition process including, but not limited to, CVD, PECVD, sputtering, chemical solution deposition or plating.

After deposition, portions of the first diffusion barrier 12 and the first conductive structure 14 that are located above the top surface of the base dielectric material layer 10 may be removed by a conventional planarization process such as, for example, CMP. In some embodiments of the present application, a metal cap (not shown) including cobalt, cobalt tungsten phosphor (CoWP), or graphene may be formed over the first conductive structure 14 after the planarization process.

The material stack formed on the topmost surfaces of the lower interconnect level 8 may include, for example, a dielectric cap layer 20, a first dielectric material layer 22 and a sacrificial metal template layer 24.

The dielectric cap layer 20 can protect underlying lower interconnect level 8 from impurities that may diffuse down from upper levels, and can function as a diffusion barrier layer that prevents vertical diffusion of metallic impurities, moisture, or other gaseous impurities. The dielectric cap layer 20 may include, for example, silicon nitride, silicon oxynitride, silicon carbide, nitrogen and hydrogen doped silicon carbide (SiCNH), or a combination thereof. The dielectric cap layer 20 may be formed, for example, by CVD or ALD. The thickness of the dielectric cap layer 20 can be from 25 nm to 50 nm, although lesser and greater thicknesses can also be employed.

The first dielectric material layer 22 that is formed on the dielectric cap layer 20 may include a dielectric material that is the same as, or different from, the base dielectric material layer 10. The processing techniques and thickness ranges described above for the base dielectric material layer 10 are also applicable here for the first dielectric material layer 22. The first dielectric material layer 22 may include a low-k dielectric material which can be silicon oxide, organosilicates, silsequioxanes, USG, FSG, or BPSG. The first dielectric material layer 22 may be formed on by CVD, PECVD or spin coating and may have a thickness from 100 nm to 1,000 nm.

The sacrificial metal template layer 24 that is formed on the first dielectric material layer 22 may include a metal nitride such as, for example, TiN, TaN or WN that can provide good pattern fidelity while mainlining the desired dielectric properties of the underlying layers. In one embodiment, the sacrificial metal template layer 24 is composed of TiN. The sacrificial metal template layer 24 may be formed, for example, by CVD or PVD. The thickness of the sacrificial metal template layer 24 can be from 20 nm to 80 nm, although lesser and greater thicknesses can also be employed.

The dielectric hard mask layer 26 that is formed on the topmost surface of the material stack (20, 22, 24) (i.e., the top surface of the sacrificial metal template layer 24) can be employed to provide a greater mechanical strength during a subsequent planarization process. Alternately or additionally, the dielectric hard mask layer 26 can be employed as an etch mask for etching the underlying layers. The dielectric hard mask layer 26 may include, for example, silicon nitride, silicon oxynitride, organosilicate, or a combination thereof. In one embodiment, the dielectric hard mask layer 26 is composed of tetraethyl orthosilicate (TEOS). The dielectric hard mask layer 26 may be formed, for example, by PECVD, CVD or ALD. The thickness of the dielectric hard mask layer 26 may be from 15 nm to 50 nm, although lesser and greater thicknesses can also be employed.

Figure 2:
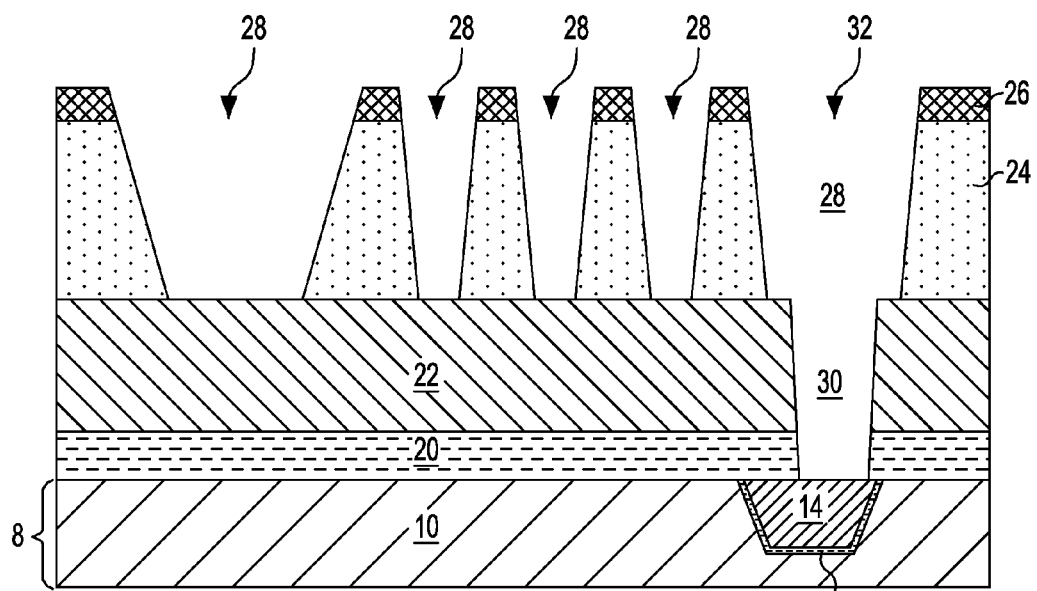
FIG. 2 is a cross-sectional view of the first exemplary semiconductor structure of FIG. 1 after forming openings in the material stack.

Referring to FIG. 2, openings are formed in the material stack (20, 22, 24). The openings may be via openings, trench openings, or combinations of a trench opening and a via opening. In one embodiment and as shown in FIG. 2, the openings include at least one first opening 28 which is a trench opening for a single damascene structure and at least one second opening 32 which is a combination of a trench opening 28 and a via opening 30 for a dual damascene structure. The at least one first opening 28 extends through the sacrificial metal template layer 24 to expose the top surface of the first dielectric material layer 22. The at least one second opening 32 extends through the sacrificial metal template layer 24, the first dielectric material layer 22 and the dielectric cap layer 20 to expose the top surface of the first conductive structure 14.

The openings 28, 32 may be formed by any suitable lithography and etching processes known in the art. For example, a via-first process may be employed to form the openings 28, 32 where a first lithographic patterning process is carried out to pattern and etch a via opening, followed by a second lithographic patterning process to pattern and etch trench openings with one trench opening intercepting the via opening.

First, a first photoresist layer (not shown) is applied over the dielectric hard mask layer 26 and lithographically patterned to form a first pattern of first openings therein. The first pattern can be a pattern for trench openings to be subsequently formed in the sacrificial metal template layer 24. The first pattern of the first openings is transferred into the dielectric hard mask layer 26 by an anisotropic etch, which can be a dry etch such as an reactive ion etch (RIE) or by a wet chemical etch employing a dilute hydrofluoric acid solution. The remaining portion of the first photoresist layer can be subsequently removed, for example, by ashing.

Next, a lithographic stack including a second photoresist layer is formed over the dielectric hard mask layer 26 and exposed surface of the sacrificial metal template layer 24 (not shown). In one embodiment, the lithographic stack may include, from bottom to top, an organic planarization layer (OPL), an antireflective coating (ARC) layer, and the second photoresist layer, with the OPL completely fills the first openings. The OPL may include an organic self-planarizing material such as, for example, a polymer with low viscosity. The ARC layer can include a silicon-containing ARC (SiARC) material.

After forming the lithographic stack, the second photoresist layer is lithographically patterned to form a second pattern including at least one second opening therein. The second pattern can be a pattern for via openings to be subsequently formed in the first dielectric material layer 22. In one embodiment, the area of one first opening and the area of one second opening overlap with each other. The second pattern is then transferred into the ARC layer and the OPL to provide a patterned lithographic stack (not shown) over the dielectric hard mask layer 26 and the material stack (20, 22, 24).

Next, the sacrificial metal template layer 24 and the first dielectric material layer 22 are etched employing the patterned lithographic stack as an etch mask to form at least one via opening through the sacrificial metal template layer 24 and the first dielectric material layer 22 to expose the top surface of the dielectric cap layer 20 (not shown). The etch of the sacrificial metal template layer 24 and the first dielectric material layer 22 can be effected by at least one anisotropic etch such as RIE which removes exposed portions of the sacrificial metal template layer 24 and the underlying first dielectric material layer 22 selective to the dielectric cap layer 20. The patterned lithographic stack may be subsequently removed by ashing. After forming the at least one via opening, another anisotropic etch which can be a dry etch, such as RIE, is performed to form the trench openings through the sacrificial metal template layer 24 using the remaining portions of the dielectric hard mask layer 26 as an etch mask. The trench openings employed for single damascene structures are herein referred to as first openings 28.

Next, another anisotropic etch is performed to etch through the exposed portion of the cap dielectric layer in the via opening, thereby revealing the first conductive structure 14 to provide an expanded via opening. The expanded via opening and the trench opening overlying the expanded via opening collectively constitutes the second opening 32.

Figure 3:
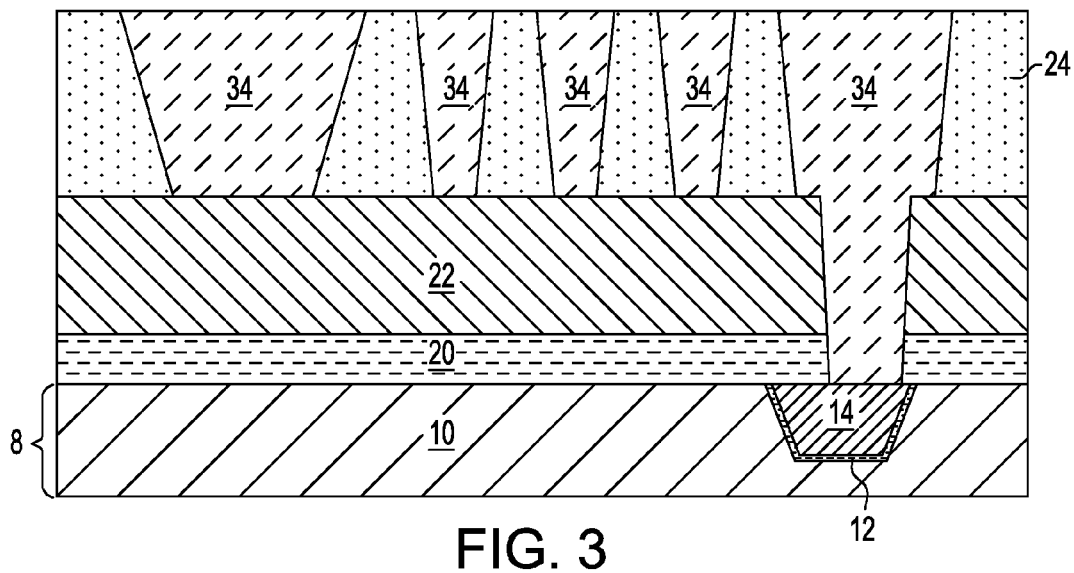
FIG. 3 is a cross-sectional view of the first exemplary semiconductor structure of FIG. 2 after forming sacrificial material portions within the openings.

Referring to FIG. 3, sacrificial material portions 34 are formed within the openings 28, 32. The sacrificial material portions 34 function as placeholders for later formed upper level interconnect structures. The sacrificial material portions 34 may include any material provided it can survive the etch chemistry employed to remove the sacrificial metal template layer 24 and can be subsequently removed without damaging to the underlying first dielectric material layer 22 and a second dielectric material layer later formed that replaces the sacrificial metal template layer 24. In one embodiment, the sacrificial material portions 34 are formed of an inorganic dielectric material such as, for example, hydrogen-doped silicon nitride (SiNH). In another embodiment, the sacrificial material portions 34 are formed of an organic polymer such as polymethylglutarimide (PMGI) or photosensitive polyimide. The sacrificial material portions 34 may be formed by depositing a sacrificial material layer (not shown) over the dielectric hard mask layer 26 and within the openings 28, 32 by a convention deposition process such as, for example, CVD, PVD or spin coating. Portions of the sacrificial material layer and the dielectric hard mask layer 26 that are formed above the sacrificial metal template layer 24 may be removed by a planarization process, such as, for example, CMP, a recess etch, or a combination thereof. After the planarization, top surfaces of the sacrificial material portions 34 are coplanar with the top surface of the sacrificial metal template layer 24.

Figure 4:
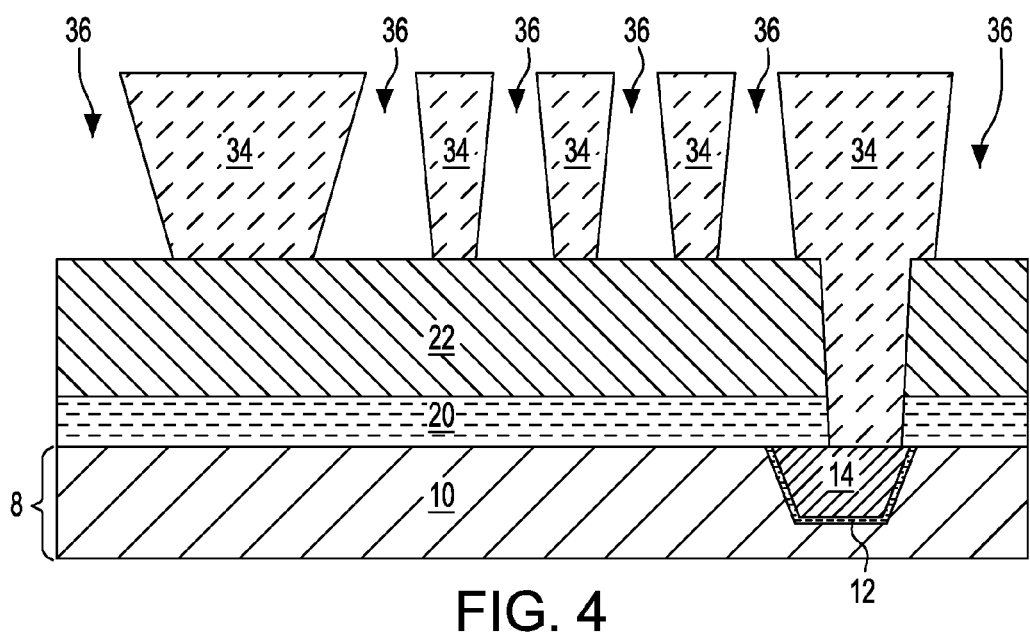
FIG. 4 is a cross-sectional view of the first exemplary semiconductor structure of FIG. 3 after removing the sacrificial metal template layer to provide voids between the sacrificial material portions.

Referring to FIG. 4, the sacrificial metal template layer 24 is removed, leaving the sacrificial material portions 34 in the structure. In one embodiment, where the sacrificial metal template layer 24 is composed of TiN and the sacrificial material portions 34 are composed of SiNH, the sacrificial metal template layer 24 may be removed by a wet chemical etch employing an aqueous solution comprising hydrogen peroxide, tetraethylammonium hydroxide (TEAH) and 1,2-cyclohexanediamine-N,N,N,N-tetraacetic acid (CDTA). The removal of the sacrificial metal template layer 24 provides voids 36 between the sacrificial material portions 34 that separate the sacrificial material portions 34 from one another.

Figure 5:
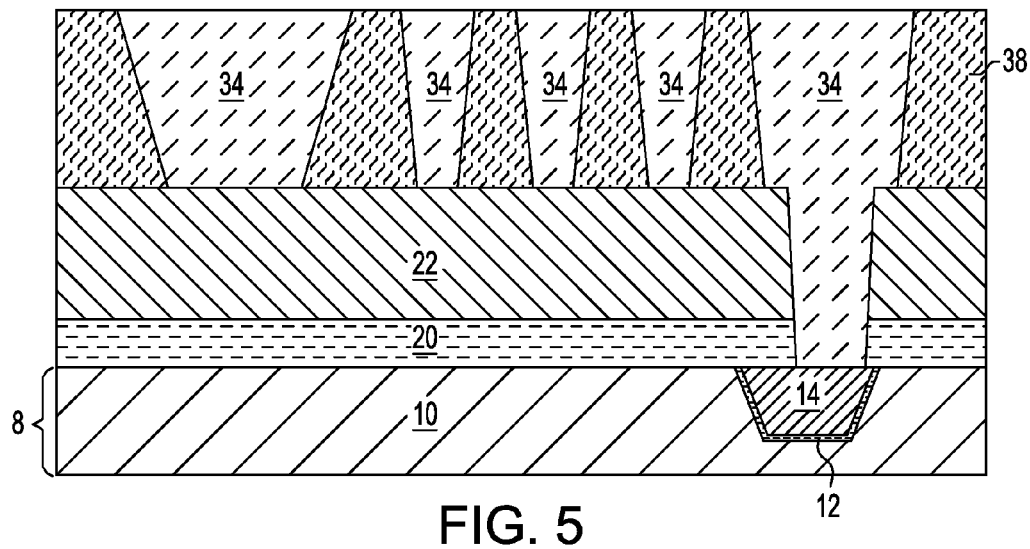
FIG. 5 is a cross-sectional view of the first exemplary semiconductor structure of FIG. 4 after forming a second dielectric material layer to fill the voids.

Referring to FIG. 5, a second dielectric material layer 38 is deposited over the first dielectric material layer 22 and the sacrificial material portions 34 to fill the voids 36. The second dielectric material layer 38 may include a spin-on dielectric material such as, for example, hydrogen silsesquioxane (HSQ) or methyl silsesquioxane (MSQ). The second dielectric material layer 38 may be deposited by spin coating and planarized using CMP after the deposition such that the top surface of the second dielectric material layer 38 is coplanar with the top surfaces of the sacrificial material portions 34.

Figure 6:
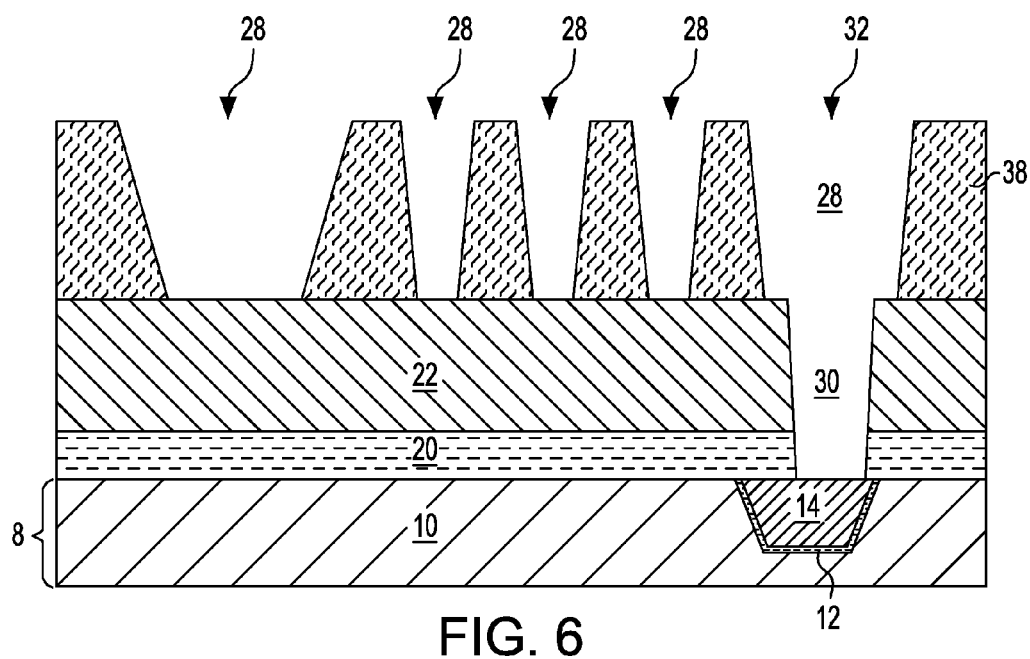
FIG. 6 is a cross-sectional view of the first exemplary semiconductor structure of FIG. 5 after removing the sacrificial material portions from the openings.

Referring to FIG. 6, the sacrificial material portions 34 are removed from the openings 28, 32 employing an etch chemistry that etches the material of the sacrificial material portions 34 selective to the dielectric materials of the dielectric cap layer 20, the first dielectric material layer 22, the second dielectric material layer 38, and the conductive material of the first conductive structure 14. In one embodiment and when the sacrificial material portions 34 include SiNH, the sacrificial material portions 34 may be removed using diluted hydrofluoric acid (DHF), or a mixture of DHF and citric acid. In another embodiment and when the sacrificial material portions 34 are formed of PMGI, the sacrificial material portions 34 may be removed using acetone, n-methyl pyrrolidone (NMP), dimethyl sulfoxide (DMSO), aminoethoxy, or ethanol. The removal of the sacrificial material portions 34 re-exposes the first dielectric material layer 22 in the first openings 28 and the first conductive structure 14 in the second opening 32. The first openings 28 are laterally surrounded by the second dielectric material layer 36, while the second opening 32 is laterally surrounded by a stack of the dielectric cap layer 20, the first dielectric material layer 22 and the second dielectric material layer 38.

Figure 7:
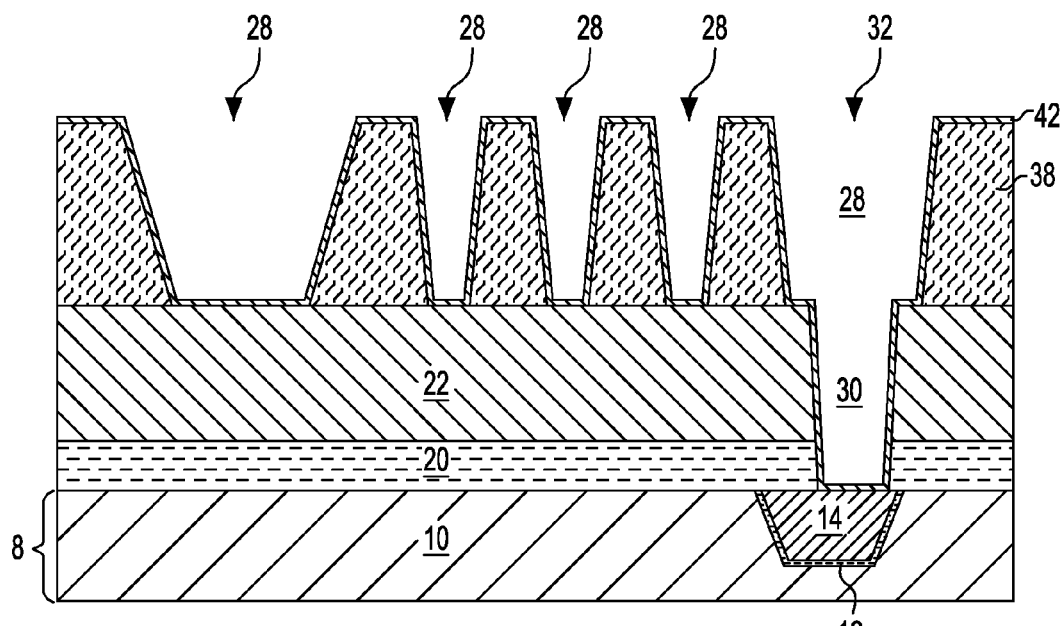
FIG. 7 is a cross-sectional view of the first exemplary semiconductor structure of FIG. 6 after forming a diffusion barrier layer over sidewalls and bottom surfaces of the openings.

Referring to FIG. 7, a diffusion barrier layer 42 is conformally deposited over sidewalls and bottom surfaces of the openings 28, 32 and the top surface of the second dielectric material layer 38. The diffusion barrier layer 42 is formed to prevent diffusion of contaminates from and/or into conductive structures to be subsequently formed, as well as to promote adhesion of the conductive structures to the third dielectric material layer 38. The diffusion barrier layer 42 may include Ta, TaN, W, WN, TiN, or a stack thereof such as Ta/TaN, Ta/TaN/Ta and Ti/TiN. In one embodiment, the diffusion barrier layer 42 is a bilayer stack of TaN/Ta. The diffusion barrier layer 42 may be formed, for example, by CVD, ALD, PECVD or PVD. The diffusion barrier layer 42 that is formed have a thickness from 4 nm to 40 nm, although lesser and greater thicknesses can also be employed.

Optionally a copper seed layer (not shown) is formed atop the diffusion barrier layer 42. The copper seed layer may be employed to selectively promote subsequent electroplating of a layer of copper or a copper alloy. The copper seed layer may comprise copper or a copper alloy. The copper seed layer may be formed, for example, by CVD, PECVD, ALD, or PVD. The copper seed layer that is formed may have a thickness from 0.5 nm to 10 nm, although lesser and greater thicknesses can also be employed.

Figure 8:
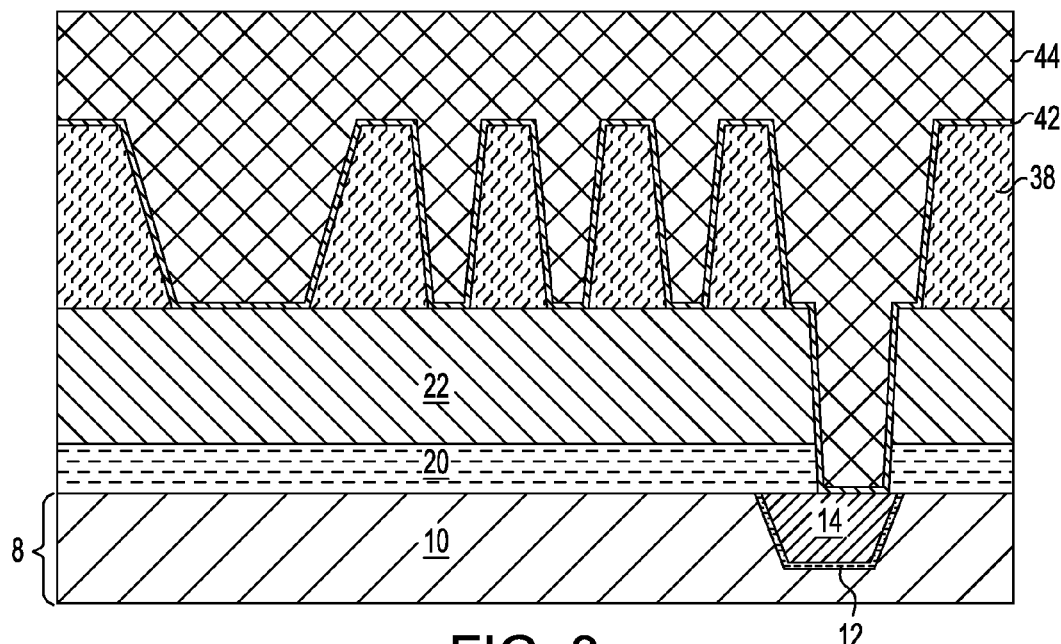
FIG. 8 is a cross-sectional view of the first exemplary semiconductor structure of FIG. 7 after forming a conductive material layer on the diffusion barrier layer to fill the openings.

Referring to FIG. 8, a conductive material layer 44 is formed on the diffusion barrier layer 42, or on the copper seed layer, if present, to completely fill the openings 28, 32. The conductive material layer may include a metal such as, for example, Cu, Al, W, Ti, Ta or their alloys. The conductive layer material layer 44 may be formed by a conventional deposition process such as, for example, CVD, PVD, ALD, or plating. The conductive material layer 44 is deposited to a thickness so that a topmost surface of the conductive material layer 44 is located above the top surface of the second dielectric material layer 38.

Figure 9:
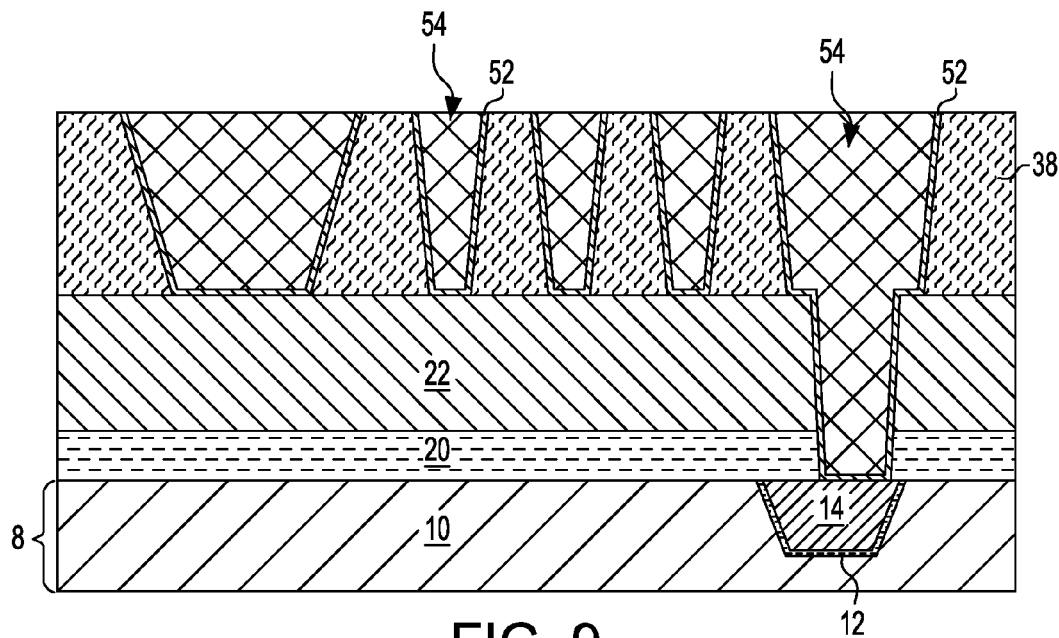
FIG. 9 is a cross-sectional view of the first exemplary semiconductor structure of FIG. 8 after planarizing the diffusion barrier layer and the conductive material layer.

Referring to FIG. 9, once the openings 28, 32 are completely overfilled with the conductive material layer 44, portions of the conductive material layer 44, the copper seed layer, if present, and the diffusion barrier layer 42 that are located above the top surface of the second dielectric material layer 38 are removed by employing a planarization process such as, for example, CMP. The remaining portion of the diffusion barrier layer 42 in each of openings 28, 32 constitutes a second diffusion barrier 52. The remaining portion of the conductive material layer 44 in each of the openings 28, 32 constitutes a second conductive structure 54. The second diffusion barrier 52 and the second conductive portion 54A within each of the openings 28, 32 together define an upper level interconnect structure. The upper level interconnect structure (52, 54) that is formed in each of the first openings 28 is laterally surrounded by the second dielectric material layer 38. The upper level interconnect structure (52, 54) that is formed in the second opening 32 is laterally surrounded by a stack of the second dielectric material layer 38, the first dielectric material layer 22 and the dielectric cap layer 20.

In the present application, because openings for forming the interconnect structures are formed by subtractive etching a sacrificial metal template layer which possesses a greater mechanical strength than the low-k dielectric material employed in a conventional damascene process, well-defined pattern profile can be obtained. In addition, because the low-k material layer that replaces the sacrificial metal template layer to be present in the final interconnect structures is deposited after the opening etch processes, damages to the low-k dielectric material layer caused by etch/strip plasmas and chemicals in the conventional damascene process can be reduced. Furthermore, because the metal deposition to fill the interconnect openings is performed after replacing sacrificial metal template layer with the low-k dielectric layer, contamination of metal interconnect structures by the chemical residues from the metal plasma etch can be eliminated. As a result, the reliability of the ICs can be greatly enhanced.

Figure 10:
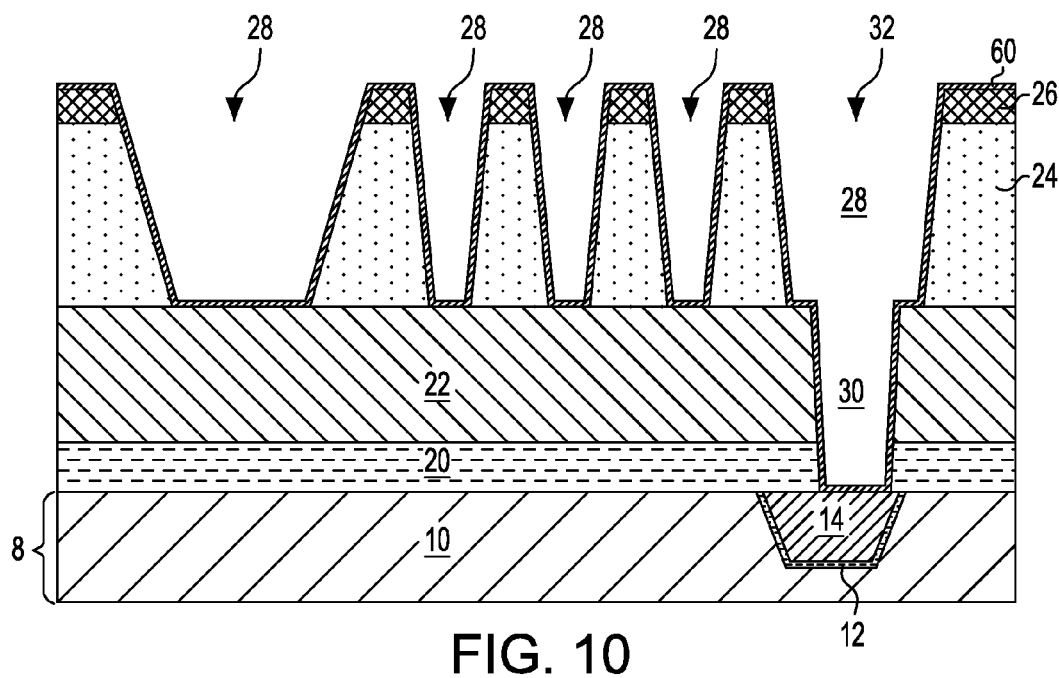
FIG. 10 is a cross-sectional view of a second exemplary semiconductor structure that can be derived from the first exemplary semiconductor structure of FIG. 2 after forming a protective liner layer over exposed surfaces of the dielectric hard mask layer and sidewalls and bottom surfaces of the openings according to a second embodiment of the present application.

Referring to FIG. 10, a second exemplary semiconductor structure of the present application according to a second embodiment of the present application is derived from the first exemplary semiconductor structure of FIG. 2 by conformally depositing a protective liner layer 60 over exposed surfaces of the dielectric hard mask layer 26 and sidewalls and bottom surfaces of the openings 28, 32. The protective liner layer 60 permits better control over the critical dimensions (CDs) of the openings 28, 32 during subsequent CMP and RIE processes. The protective liner layer 60 may include Ta, Ti, SiN, or SiC. The protective liner layer 60 may be formed utilizing a conventional deposition process including CVD or ALD. The thickness of the protective liner layer that is formed may be from 1 nm to 10 nm.

Figure 11:
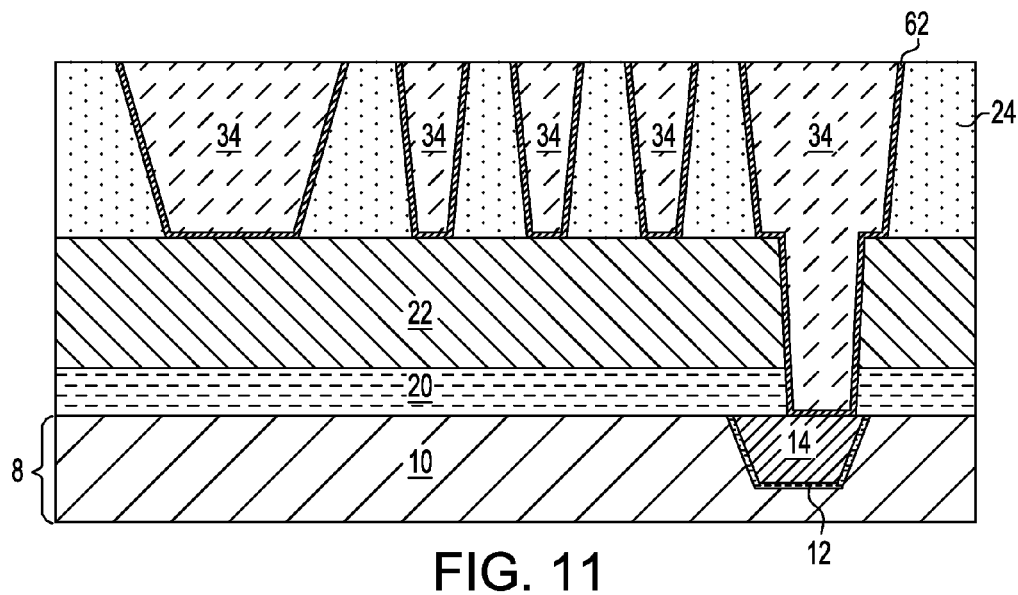
FIG. 11 is a cross-sectional view of the second exemplary semiconductor structure of FIG. 10 after forming sacrificial material portions on protective liners that are present on the sidewalls and bottom surface of the openings to fill the openings.

Referring to FIG. 11, sacrificial material portions 34 are formed to fill remaining volumes of the openings 28, 32 by performing processing steps of FIG. 3. Portions of the protective liner layer 60 that are located above the top surface of the sacrificial metal template layer 24 are removed by, for example, CMP. The CMP process also removes the dielectric hard mask layer 26. Remaining portions of the protective liner layer 60 that are present on sidewalls and bottom surfaces of the openings 28, 30 are herein referred to as protective liners 62.

Figure 12:
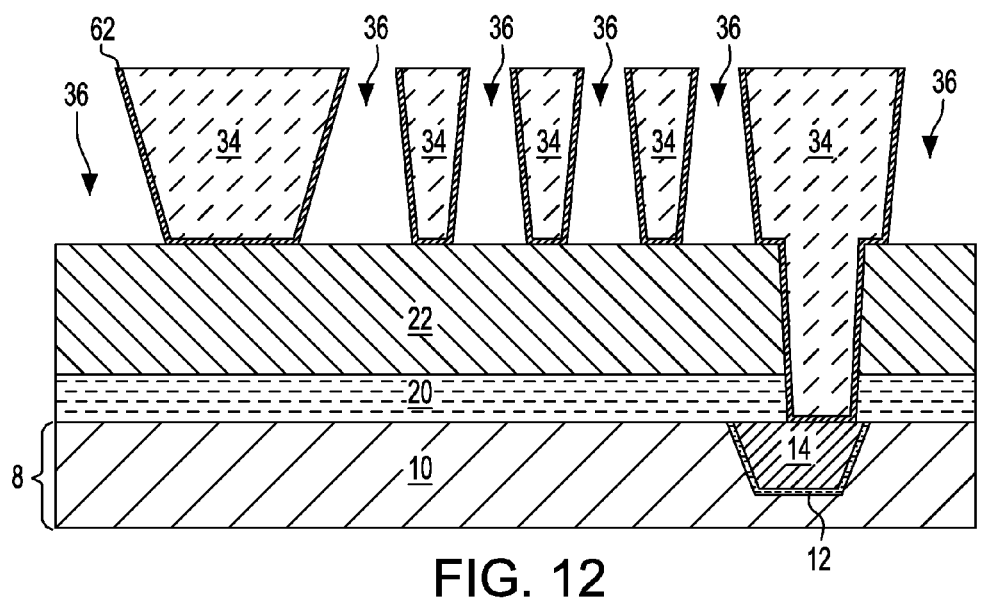
FIG. 12 is a cross-sectional view of the second exemplary semiconductor structure of FIG. 11 after removing the sacrificial metal template layer to provide voids between the sacrificial material portions.

Referring to FIG. 12, the sacrificial metal template layer 24 is removed by performing the processing steps of FIG. 4 to provide voids 36 between the sacrificial material portions 34.

Figure 13:
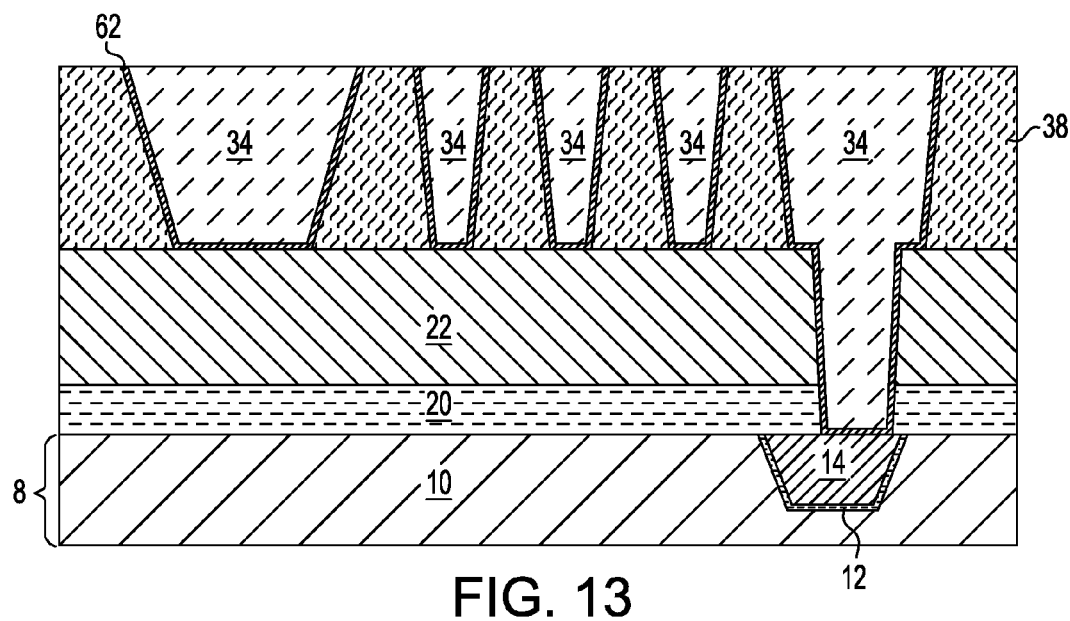
FIG. 13 is a cross-sectional view of the second exemplary semiconductor structure of FIG. 12 after forming a second dielectric material layer to fill the voids.

Referring to FIG. 13, a second dielectric material layer 38 is formed to fill the voids 36 by performing the processing steps of FIG. 5.

Figure 14:
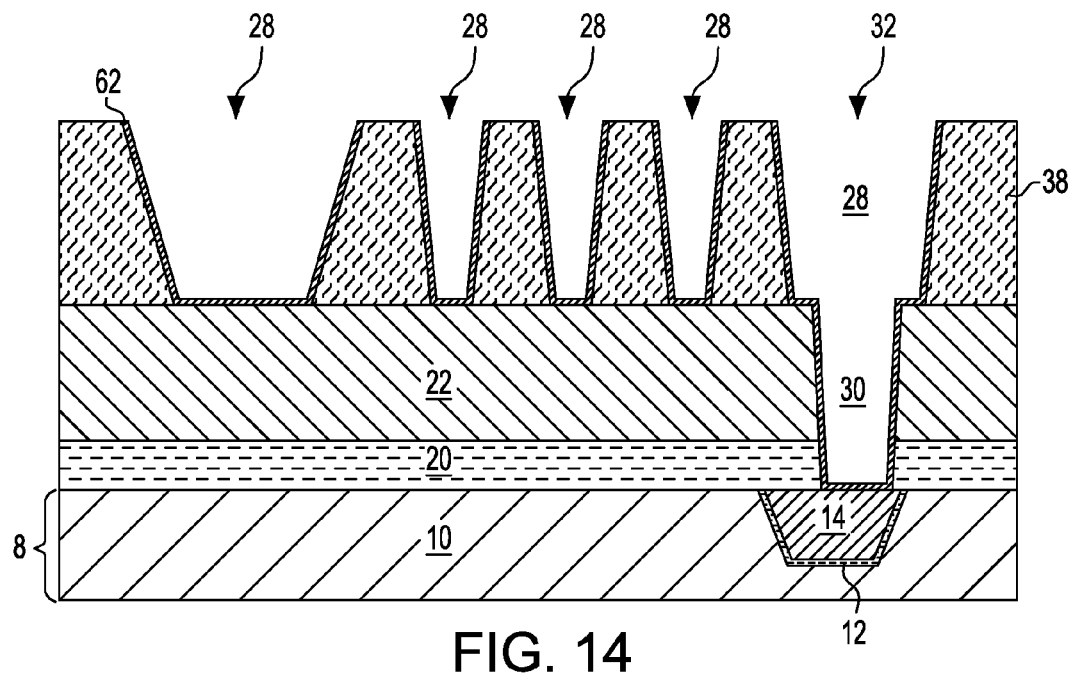
FIG. 14 is a cross-sectional view of the second exemplary semiconductor structure of FIG. 13 after removing the sacrificial material portions from the openings.

Referring to FIG. 14, the sacrificial material portions 34 are removed from the openings 28, 32 by performing the processing steps of FIG. 6.

Figure 15:
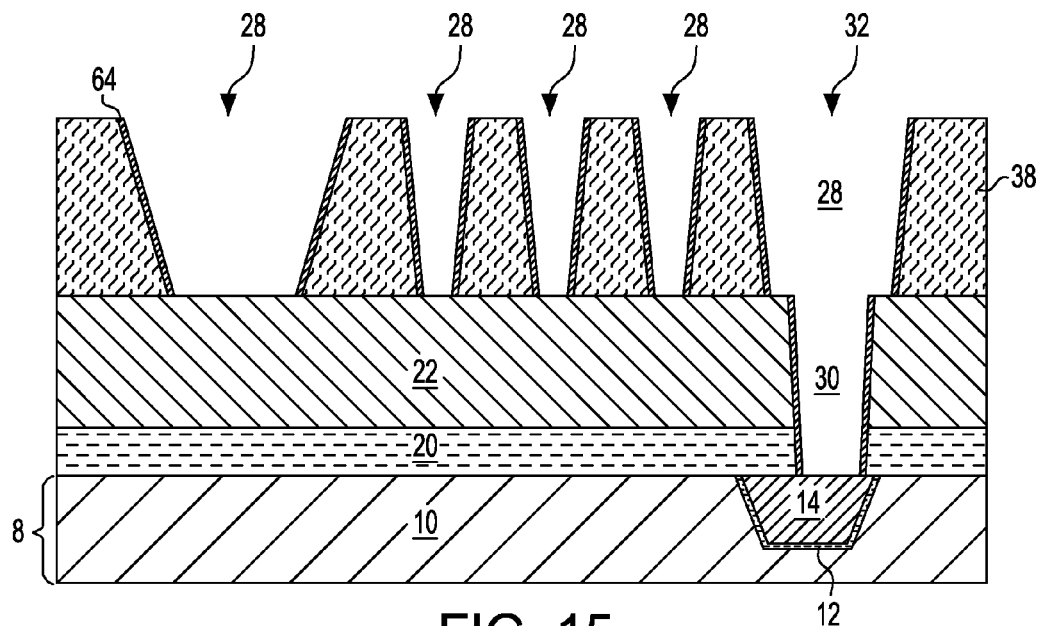
FIG. 15 is a cross-sectional view of the second exemplary semiconductor structure of FIG. 14 after removing portions of protective liners from the bottom surfaces of the openings.

Referring to FIG. 15, portions of the protective liners 62 are removed from the bottom surfaces of openings 28, 32 by an anisotropic etch such as, for example, RIE. The removal of portions of the protective liners 62 that are located on the bottom surfaces of the first openings 28 re-exposes the first dielectric material layer, while the removal of the portion of the protective liner 62 from the second opening 30 re-exposes the first conductive structure 14. The remaining portions of the protective liners 62 present on sidewalls of the openings 28, 32 constitute protective liner portions 64.

Figure 16:
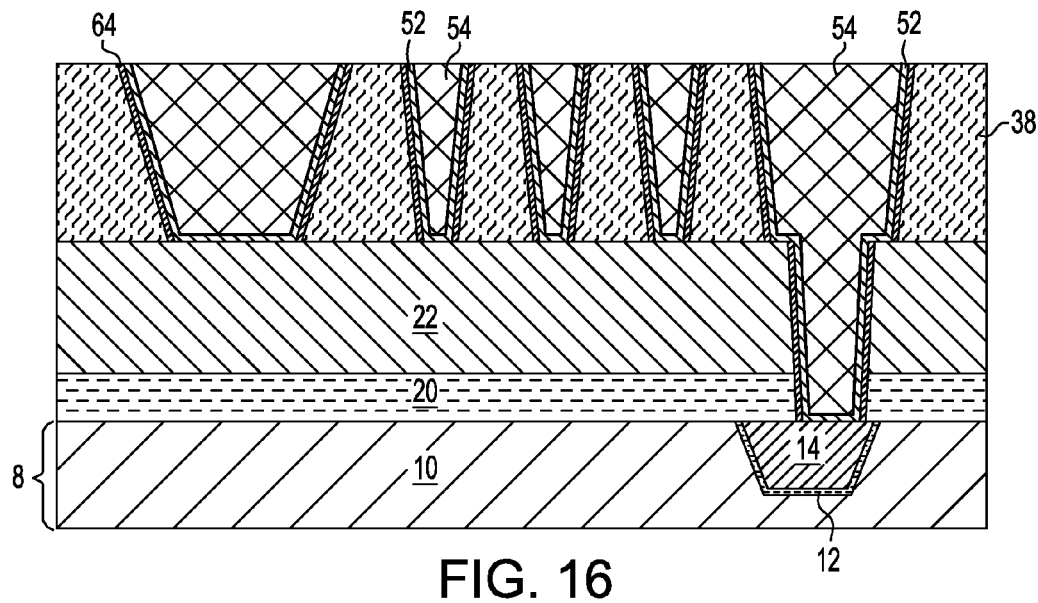
FIG. 16 is a cross-sectional view of the second exemplary semiconductor structure of FIG. 15 after forming second diffusion barriers and second conductive structures in the openings.

Referring to FIG. 16, upper interconnect structures (52, 54) are formed in the openings 28, 30 by performing processing steps of FIG. 7-9. Each of the first conductive structures (52, 54) includes a second diffusion barrier 52 present on the protective liner portions 64 and a bottom surface of each of the openings 28, 32 and a second conductive structure 54 filling each of the openings 28, 32.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming an interconnect structure comprising:
    forming at least one opening through a material stack comprising a first dielectric material layer and a sacrificial metal template layer present on the first dielectric material layer;
    forming a sacrificial material portion to fill the at least one opening;
    removing the sacrificial metal template layer to provide voids surrounding the sacrificial material portion;
    forming a second dielectric material layer to fill the voids;
    removing the sacrificial material portion from the at least one opening; and
    forming a conductive material layer in the at least one opening.

2. The method of claim 1, wherein the first dielectric material layer comprises silicon dioxide, organosilicates, silsequioxanes, undoped silicate glass (USG), fluorosilicate glass (FSG), or borophosphosilicate glass (BPSG).

3. The method of claim 1, wherein the second dielectric material layer comprises hydrogen silsesquioxane (HSQ) or methyl silsesquioxane (MSQ).

4. The method of claim 1, wherein the material stack is formed on a lower interconnect layer including at least one conductive structure located within a base dielectric material layer.

5. The method of claim 4, wherein the material stack further comprises a dielectric cap layer on which the first dielectric material layer is present, wherein the at least one opening extends through the sacrificial metal template layer, the first dielectric material layer and the dielectric cap layer to expose at least a portion of the at least one conductive structure in the lower interconnect layer.

6. The method of claim 5, wherein the forming the at least one opening through the material stack comprises:
    forming a dielectric hard mask layer on the sacrificial metal template layer; and
    patterning the dielectric hard mask layer, the sacrificial metal template layer, the first dielectric material layer and the first dielectric cap layer to provide the at least one opening, the at least one opening exposing at least the portion of the at least one conductive structure in the lower interconnect layer.

7. The method of claim 1, wherein the sacrificial metal template layer comprises metal nitride selected from the group consisting of TiN, TaN or WN.

8. The method of claim 1, wherein the sacrificial material portion comprises hydrogen-doped silicon nitride (SiNH), polymethylglutarimide (PMGI), or photosensitive polyimide.

9. The method of claim 1, further comprising forming a diffusion barrier layer on sidewalls and a bottom surface of the at least one opening before the forming the conductive material layer.

10. The method of claim 9, wherein the diffusion barrier layer comprises Ta, TaN, W, WN, TiN, Ta/TaN, Ta/TaN/Ta, or Ti/TiN.

11. The method of claim 9, further comprising removing portions of the diffusion barrier layer and the conductive material layer from a top surface of the second dielectric material layer.

12. A method of forming an interconnect structure comprising:
    forming at least one opening through a material stack comprising a first dielectric material layer and a sacrificial metal template layer present on the first dielectric material layer;
    forming a protective liner on sidewalls and a bottom surface of the at least one opening;
    forming a sacrificial material portion to fill the at least one opening;
    removing the sacrificial metal template layer to provide voids surrounding the sacrificial material portion;
    forming a second dielectric material layer to fill the voids;
    removing the sacrificial material portion from the at least one opening;

removing at least a portion of the protective liner that is present on the bottom surface of the at least one opening; and forming a conductive material layer to fill the at least one opening.

13. The method of claim 12, wherein the first dielectric material layer comprises silicon dioxide, organosilicates, silsequioxanes, undoped silicate glass (USG), fluorosilicate glass (FSG), or borophosphosilicate glass (BPSG), and wherein the second dielectric material layer comprises hydrogen silsesquioxane (HSQ) or methyl silsesquioxane (MSQ).

14. The method of claim 12, wherein the protective liner layer comprises Ta, Ti, SiN, or SiC.

15. The method of claim 12, wherein the material stack is formed on a lower interconnect layer including at least one conductive structure located within a base dielectric material layer.

16. The method of claim 15, wherein the stack of the material layers further comprises a dielectric cap layer on which the first dielectric material layer is present, wherein the at least one opening extends through the sacrificial metal template layer, the first dielectric material layer and the dielectric cap layer to expose at least a portion of the at least one conductive structure in the lower interconnect layer.

17. The method of claim 16, wherein the forming at least one opening through the material stack comprises:

forming a dielectric hard mask layer on the sacrificial metal template layer; and patterning the dielectric hard mask layer, the sacrificial metal template layer, the first dielectric material layer and the dielectric cap layer to provide the at least one opening, the at least one opening exposing the portion of the at least one conductive structure in the lower interconnect layer.

18. The method of claim 12, wherein the sacrificial metal template layer comprises metal nitride selected from the group consisting of TiN, TaN, or WN.

19. The method of claim 12, wherein the sacrificial material portion comprises hydrogen-doped silicon nitride (SiNH), polymethylglutarimide (PMGI), or photosensitive polyimide.

20. The method of claim 12, further comprising forming a diffusion barrier layer on remaining portions of the protective liner and exposed bottom surface of the at least one opening before the forming the conductive material layer.

\* \* \* \* \*